United States Patent [19]

Lur et al.

[11] Patent Number: 5,665,632
[45] Date of Patent: Sep. 9, 1997

[54] STRESS RELAXATION IN DIELECTRIC BEFORE METALIZATION

[75] Inventors: Water Lur, Taipei; Edward Houn, Tainan, both of Taiwan

[73] Assignee: United Microelectronics Corporation, Hsin-Chu, Taiwan

[21] Appl. No.: 608,071

[22] Filed: Feb. 28, 1996

Related U.S. Application Data

[62] Division of Ser. No. 195,090, Feb. 14, 1994, Pat. No. 5,516,720.
[51] Int. Cl.$^6$ .......................... H01L 21/31; H01L 21/764
[52] U.S. Cl. ............................ 438/422; 438/427; 438/433
[58] Field of Search .............................. 437/64, 65, 67, 437/927; 148/DIG. 73, DIG. 81

[56] References Cited

U.S. PATENT DOCUMENTS

| | | | |
|---|---|---|---|
| 4,104,086 | 8/1978 | Bondur et al. | 156/643.1 |
| 4,639,288 | 1/1987 | Price et al. | 437/67 |
| 5,041,898 | 8/1991 | Urabe | 437/67 |
| 5,099,304 | 3/1992 | Takemura et al. | 357/49 |
| 5,119,164 | 6/1992 | Sliwa, Jr. et al. | 357/54 |
| 5,278,103 | 1/1994 | Mallon et al. | 437/978 |
| 5,292,689 | 3/1994 | Cronin et al. | 437/67 |
| 5,308,786 | 5/1994 | Lur et al. | 437/67 |
| 5,374,583 | 12/1994 | Lur et al. | 437/64 |
| 5,444,015 | 8/1995 | Aitken et al. | 437/927 |
| 5,453,395 | 9/1995 | Lur | 437/67 |
| 5,516,721 | 5/1996 | Galli et al. | 437/67 |

FOREIGN PATENT DOCUMENTS

| | | | |
|---|---|---|---|
| 3-229443 | 10/1991 | Japan | 437/67 |
| 4-151850 | 5/1992 | Japan | 437/67 |

OTHER PUBLICATIONS

Sze, S.M., "VLSI Technology," International Edition, McGraw-Hill Book Company, NY, NY, 1988, pp. 473-474, 476-477.

Wolf, "Silicon Processing, vol. II," pp. 56, 197, 240-241, (1990).

Wolf & Tauber, "Silicon Processing, vol. I," pp. 335, 368-369, (1986).

IBM Tech. Discl. Bulletin 28, 1986, pp. 4594-4595.

*Primary Examiner*—Charles L. Bowers, Jr.
*Assistant Examiner*—Leon Radomsky
*Attorney, Agent, or Firm*—William H. Wright

[57] ABSTRACT

A new method of trench isolation incorporating thermal stress releasing voids is described. Two sets of narrow trenches are etched into the silicon substrate not covered by a photoresist mask wherein the second set of trenches alternate with the first set of trenches. The first set of trenches is filled with an insulating layer. A second insulating layer is deposited over the surface of the substrate and within the second set of trenches wherein said insulating layer has step coverage such that voids are formed and are completely enclosed within the second set of trenches completing the thermal stress releasing device isolation of the integrated circuit. The method of forming thermal stress released polysilicon gate spacers in an integrated circuit is described. Polysilicon gate electrodes are formed on the surface of the semiconductor substrate. Sucessive sidewalls are formed on the gate electrodes of thin silicon dioxide, silicon nitride, and silicon dioxide. The silicon nitride spacers are removed leaving trenches between the thin silicon dioxide sidewalls and the silicon dioxide spacers. A thin insulating material is deposited over the surface of the gate electrodes and the sidewalls with a step coverage such that the trenches between the thin oxidation and the silicon dioxide spacers are not filled by the thin insulating layer but are covered by the thin insulating layer leaving voids which complete the thermal stress released polysilicon gate spacer formation in the fabrication of an integrated circuit.

13 Claims, 7 Drawing Sheets

STRESS RELAXATION IN DIELECTRIC BEFORE METALIZATION

This application is a divisional of application Ser. No. 08/195,090, filed on Feb. 14, 1994, now U.S. Pat. No. 5,516,720.

RELATED PATENT APPLICATION (1) U.S. patent application Ser. No. 08/083481 by Water Lur, J. T. Lin, H. S. Liaw entitled "Stress Released VLSI Structure by Void Formation" filed on Jun. 30, 1993.

BACKGROUND OF THE INVENTION

(1) Field of the Invention

This invention relates to the fabrication of integrated circuit devices and more particularly to a method of reducing thermal stress by controlled void formation within gate spacers and trench oxide of an integrated circuit device.

(2) Description of the Prior Art

Local oxidation of silicon is the conventional lateral isolation scheme. The conventional local oxidation process (LOCOS) is described in VLSI Technology, International Edition, by S. M. Sze, McGraw-Hill Book Company, NY, N.Y., c. 1988 by McGraw-Hill Book Co., pp. 473–474. A layer of silicon nitride is deposited over a pad oxide overlying a silicon substrate. The pad oxide is a thin thermal oxide which allows better adhesion between the nitride and silicon and acts as a stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation. FIG. 1 illustrates a conventional VLSI circuit with local oxidation before metallization. Field oxide regions 2 have been formed in and on the semiconductor substrate 1. Polysilicon gate electrodes 5 have been formed overlying a gate oxide layer 4 or field oxide regions 2. Spacers 6 have been formed on the sidewalls of the gate electrodes and all is covered with an insulating layer 7.

On pp. 476–477 of the aforementioned textbook, Sze describes some of the disadvantages of the growth of field oxide using the local oxidation method. The field oxide will penetrate under the masking nitride layer causing the space between transistors to grow during oxidation. This oxide growth under nitride is called "bird's beak encroachment." Other problems include stress in the oxide in the region covered by the nitride mask, white ribbon effect (a narrow region of nonoxidized silicon), thinning of the field oxide in narrow openings, and a non-recessed surface.

Many new isolation processes have been developed to overcome these drawbacks. Trench isolation schemes are the most attractive candidates. Typically, deep narrow trenches are used to isolate one device from another. Shallow trenches are used to isolate elements within a device, and wide trenches are used in areas where interconnection patterns will be deposited. FIG. 2 illustrates the same VLSI circuit as in FIG. 1 except that trench isolation regions 3 have been used instead of field oxide regions 2 in FIG. 1. Trench isolation can solve most of the drawbacks of the LOCOS isolation process except for stress. In addition, lightly doped drain (LDD) structures in very large scale integrated circuits (VLSI) require the formation of gate spacers which cause extreme stress in the underlying silicon substrate forming destructive defects.

Conventional integrated circuit processes are designed to be void free in the layered structure before and after metal deposition to avoid the electro/stress migration of metal. For example, U.S. Pat. No. 5,099,304 to Takemura et al discloses the formation of voids in Prior Art (FIG. 2a) as being undesirable.

However, the stress inherently comes from the thermal coefficient difference of expansion between the layers. The stress in a layer can be represented by the following:

$$S_f = (a_f - a_s)(T_r - T_o)E$$

where $S_f$ is the stress of the current layer measured at room temperature, $a_f$ and $a_s$ are thermal coefficients of expansion for this layer and the substrate, respectively (substrate here is defined to be the combination of all layers, including the silicon wafer, under this layer)

$T_r$ is the temperature of the layer to be thermally treated, or the formation temperature, $T_o$ is room temperature, i.e. stress measuring temperature, and E is Young's modulus of film.

Therefore, all thermal cycles result in thermal stress in each layer as well as in all underlying layers. The stress can be up to $5 \times 10^9$ dynes/cm$^2$ and even larger. The relaxation of stress results in metal failure, dielectric cracking, and defects in the silicon substrate.

U.S. Pat. No. 5,119,164 to Sliwa, Jr. et al describes a method of forming voids within a spin-on-glass layer to relieve stresses leading to cracking of the spin-on-glass layer. However, spin-on-glass cannot adequately fill some of the small spaces existing in the submicron regime. In addition, there are other drawbacks associated with using spin-on-glass as the intermetal dielectric, such as moisture outgassing, via leakage, and field inversion. It is desirable to use a material other than spin-on-glass for the trench isolation material and gate electrode spacer formation in the fabrication of integrated circuits.

FIG. 3 illustrates the same VLSI circuit as illustrated in FIG. 1 except that thermal stress releasing voids 8 have been formed within the trench isolation regions 3 and the gate spacers 6.

SUMMARY OF THE INVENTION

A principal object of the invention is to provide an effective and very manufacturable method to locally oxidize the silicon in an integrated circuit.

Another object of the present invention is to provide a method of local oxidation of silicon that will have no "bird's beak" or white ribbon effect.

Yet another object is to provide a method of local oxidation which is free of oxide thinning in narrow openings.

Yet another object of the invention is to provide a method of locally oxidizing the silicon in an integrated circuit whereby a minimum of stress is generated.

It is a further object of the invention to provide a method of forming gate spacers whereby a minimum of stress is generated.

In accordance with the objects of this invention, a new method of trench isolation incorporating thermal stress releasing voids is achieved. A first series of narrow trenches is etched into the silicon substrate. Two alternative methods of trench isolation are described, the first using silicon nodules and the second using a plurality mask pattern. An insulating layer is deposited into the first set of trenches. The insulating layer is etched back to leave spacers on the sidewalls of the first set of trenches wherein the spacers fill the narrow first set of trenches. A second set of trenches is etched into the silicon substrate not covered by a photoresist mask and the spacers wherein the second set of trenches is immediately contiguous with the first set of trenches and wherein the first and second sets of trenches together correspond to the wide and narrow openings. A second insulating layer is deposited over the surface of the substrate and within the trenches wherein said insulating layer has step coverage such that voids are formed within said second set of trenches and wherein said voids are completely enclosed within said insulating layer within said second set of trenches. The voids formed within the second insulating layer complete the thermal stress releasing device isolation of the integrated circuit.

The method of forming thermal stress released polysilicon gate spacers in an integrated circuit is described. Polysilicon gate electrodes are formed on the surface of the semiconductor substrate. A thin layer of silicon oxide is formed on the sidewalls of the patterned polysilicon layer. Silicon nitride spacers are formed on the sidewalls of the gate electrodes. Silicon dioxide spacers are formed on the sidewalls of the silicon nitride spacers. A thin silicon oxide layer is formed over the top surfaces of the gate electrodes. The silicon nitride spacers are removed leaving voids between the thin silicon dioxide sidewalls and the silicon dioxide spacers. A thin insulating material is deposited over the surface of the gate electrodes and the silicon dioxide sidewalls wherein the thin insulating material has a step coverage so that the voids between the thin oxidation and the silicon dioxide spacers are not filled by the thin insulating layer but are covered by the thin insulating layer and etching back the insulating layer completing the thermal stress released polysilicon gate spacer formation in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 4:
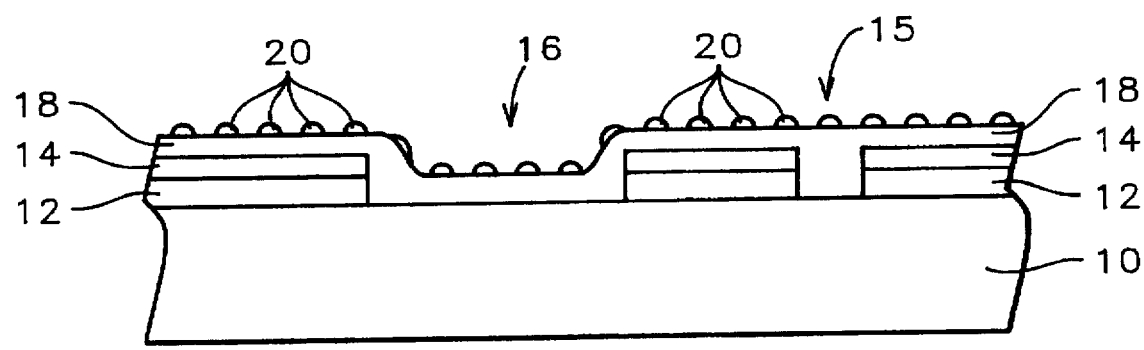
FIGS. 4 through 7 schematically illustrate in cross-sectional representation one preferred embodiment of this invention.

Referring to FIGS. 4 through 7, the first preferred embodiment will be described wherein voids will be formed within trench isolation regions. Referring now more particularly to FIG. 4, there is shown a monocrystalline silicon substrate 10. A layer 12 of silicon dioxide or silicon nitride is chemically vapor deposited (CVD) or thermally grown on the surface of the substrate to a preferred thickness of between about 2000 to 4000 Angstroms. A layer 14 of polysilicon is deposited by CVD over the silicon dioxide or silicon nitride insulating layer 12 to a thickness of between about 1000 to 2000 Angstroms. A field oxide (FOX) mask pattern is laid over the surface of the substrate and the layers 12 and 14 are etched to provide narrow openings 15 and wide openings 16 to expose portions of the silicon substrate where the device isolation regions are to be formed. A second insulating layer of silicon dioxide or silicon nitride 18 is deposited by CVD to a preferred thickness of between about 2000 to 4000 Angstroms over the patterned surface of the substrate.

A layer of aluminum-silicon alloy AL-Si(1–4%) is sputter deposited at a temperature of 350° C. or greater to a thickness of between about 10,000 to 20,000 Angstroms over the surface of the second insulating layer 18. The metal alloy layer is reactive ion etched using $BCl_3$, $Cl_2$, or the like until all of the metal has been removed. The solubility of Si in Al is less than 0.1% at room temperature. The silicon content precipitates during the cooling stage after deposition at high temperatures. The silicon precipitates are found to distribute randomly at the aluminum grain boundaries and at the interface of the aluminum and the underlayer. It is well known that it is difficult to etch silicon during metal etching and silicon nodules 20 are always observed thereafter. An additional overetch step to get rid of these silicon nodules is necessary in metal etching. Since the solubility of aluminum in silicon is very tiny at room temperature, these silicon nodules 20 are nearly pure silicon in composition.

Figure 5:
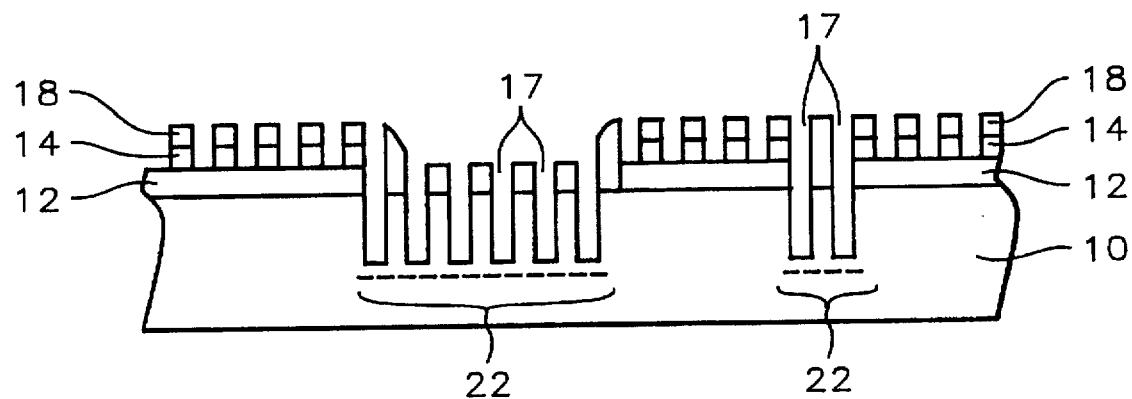

Referring now to FIG. 5, a reactive ion etch using $C_2F_6$ or the like is used to etch through the second insulating layer 18 to the polysilicon layer 14 where it exists and to the silicon substrate 10 in those portions under openings 15 and 16. The silicon nodules 20 act as an etching mask. Next, the exposed silicon substrate 10 is etched by a reactive ion etch or plasma etch using $Cl_2$, HBr, $O_2$, or the like to form narrow trenches 17 which are between about 4000 to 20,000 Angstroms deep. The second insulating layer 18 acts as a mask for this etch. The silicon nodules are also removed by this etch.

Channel-stops 22 are selectively ion implanted into the substrate through the narrow trenches 17. Boron ions are implanted with a dosage of between about 1 E 13 to 1 E 14 atoms/cm$^2$ and at an energy of between about 10 to 50 KeV. The channel-stop implants serve to prevent inversion of p-type silicon under the field oxide.

Figure 6:
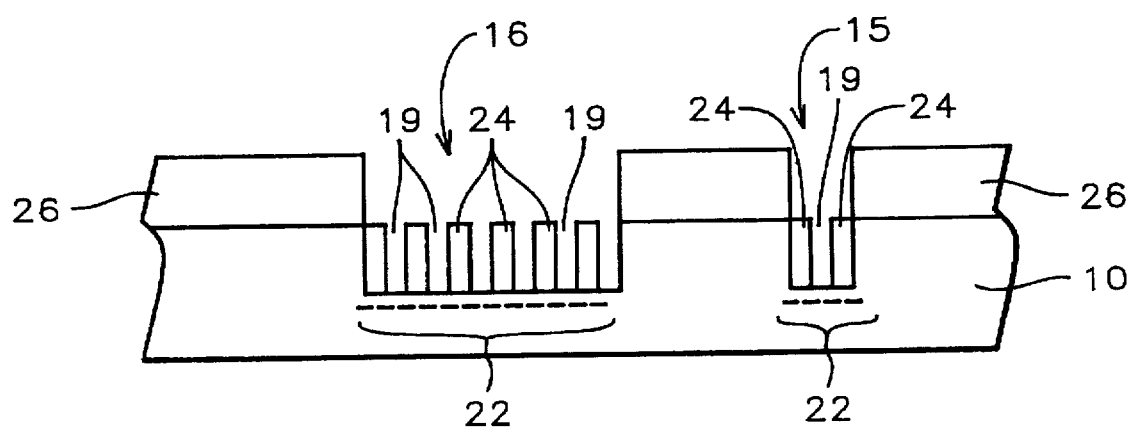

Referring now to FIG. 6, the second insulating layer 18 is stripped by a hydrofluoric acid solution for silicon dioxide or a $H_3PO_4$ solution for silicon nitride. A third insulating layer of silicon dioxide is deposited over the surface of the substrate and within the narrow trenches 17. This layer is deposited to a thickness of between about 1000 to 5000 Angstroms. This layer is etched by a reactive ion etch to form spacers 24 on the sidewalls of the trenches 17. The narrow trenches are completely filled by the spacers 24.

A layer of photoresist 26 is deposited over the surface of the substrate and patterned using the same FOX mask used to form the openings 15 and 16. A second set of narrow trenches 19 are formed within the openings 15 and 16 next to the filled trenches 17. The spacers 24 filling trenches 17 along with the photoresist 26 act as an etching mask. The trenches are etched as above to a depth of between about 4000 to 20,000 Angstroms.

A second channel-stop implantation after the second trench etching is not necessary since those dopants could diffuse to a moderate distance during the subsequent thermal cycles to play the role of channel stopping.

Figure 7:
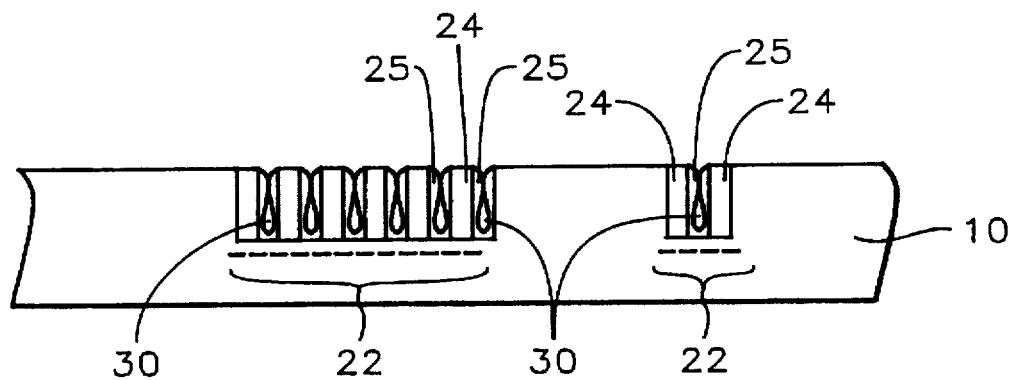

Referring now to FIG. 7, the photoresist 26 is removed. A fourth insulating layer of silicon dioxide or polysilicon is deposited by CVD or physical vapor deposition (PVD) over the surface of the substrate to a thickness of between about 1000 to 5000 Angstroms. This layer has bad step coverage of between about 20 to 80% so that the narrow trenches 19 are not completely filled with the layer. The layer is etched by a reactive ion etch to leave spacers 25 on the sidewalls of the trenches 19. Voids 30 form within the trenches 19. If polysilicon is used, it is oxidized to form silicon dioxide on the surface of the PVD polysilicon layer. The silicon dioxide layer is etched back to the surface of the substrate. The voids 30 are completely enclosed within the trenches. These voids, having a size of between about 500 to 3000 Angstroms, will allow for the release of thermal stress within the integrated circuit.

Figure 8:
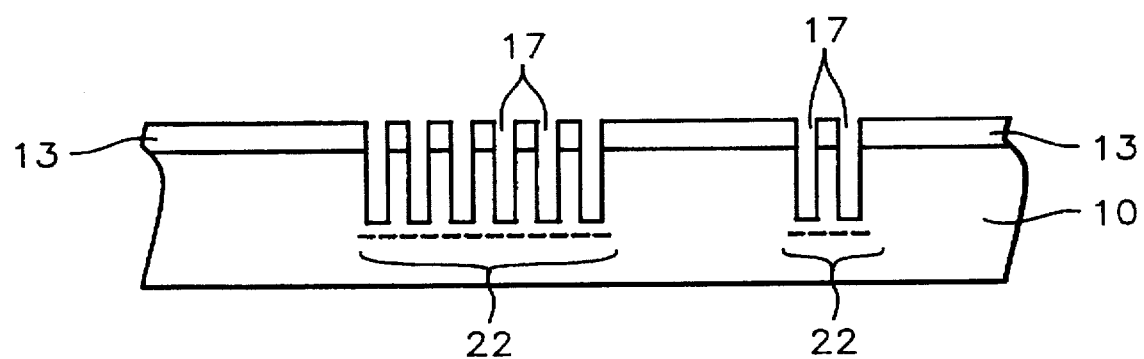
FIGS. 8 through 10 schematically illustrate in cross-sectional representation a second preferred embodiment of this invention.
Figure 9:
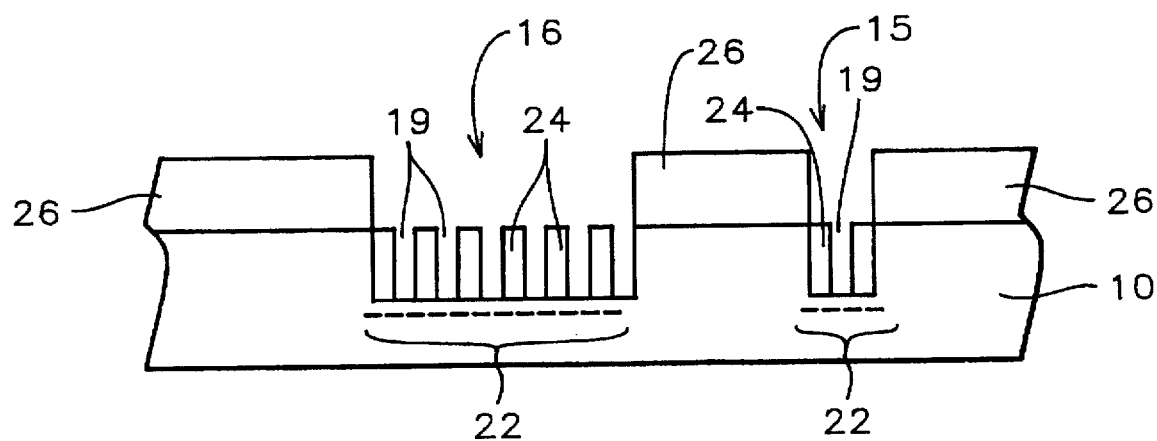
Figure 10:
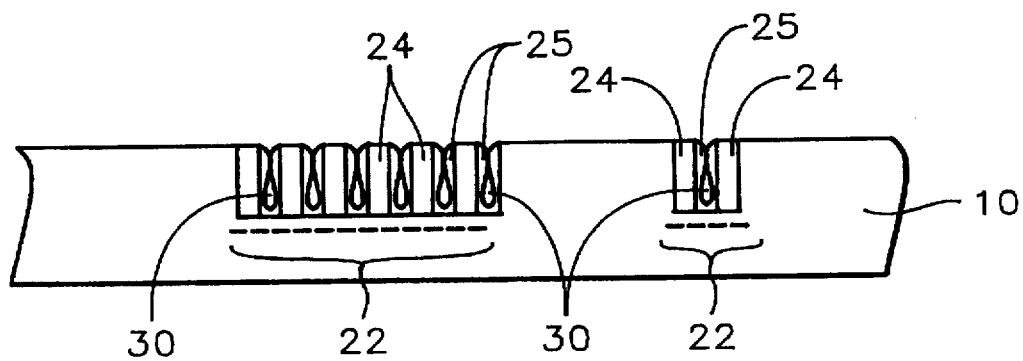

FIGS. 8 through 10 illustrate the second preferred embodiment of the present invention wherein voids will be formed within trench isolation regions. The trench isolation regions are formed using a plurality mask pattern. As in the first embodiment, there is shown a monocrystalline silicon substrate 10. A layer 13 of silicon dioxide is chemically vapor deposited (CVD) on the surface of the substrate to a preferred thickness of between about 1000 to 5000 Angstroms. A plurality mask pattern is laid over the surface of the substrate and the silicon dioxide layer 13 is etched to provide a plurality of narrow openings to expose portions of the silicon substrate where the device isolation regions are to be formed. The photoresist pattern is stripped and the exposed silicon substrate 10 is etched by a reactive ion etch or plasma etch using $Cl_2$, HBr, $O_2$, or the like to form narrow trenches 17 which are between about 4000 to 20,000 Angstroms deep. The silicon dioxide layer 13 acts as a mask for this etch.

Channel-stops 22 are selectively ion implanted into the substrate through the narrow trenches 17. Boron ions are implanted with a dosage of between about 1 E 13 to 1 E 14 atoms/$cm^2$ and at an energy of between about 10 to 50 KeV. The channel-stop implants serve to prevent inversion of p-type silicon under the field oxide.

The silicon dioxide layer 13 is stripped by a hydrofluoric acid solution. A second layer of silicon dioxide is deposited over the surface of the substrate and within the narrow trenches 17. This layer is deposited to a thickness of between about 2000 to 5000 Angstroms. This layer is etched by a reactive ion etch to form spacers 24 on the sidewalls of the trenches 17. The narrow trenches are completely filled by the spacers 24.

Referring to FIG. 9, a photoresist layer 26 is patterned using a FOX mask pattern of narrow 15 and wide 16 openings over the same areas as the plurality mask pattern. A second set of narrow trenches 19 are etched within the openings 15 and 16 next to the filled trenches 17. The trenches 17 and 19 together exactly correspond to the narrow and wide openings 15 and 16, respectively. The spacers 24 filling trenches 17 along with the photoresist layer 26 act as an etching mask. The trenches are etched as above to a depth of between about 4000 to 20,000 Angstroms.

A second channel-stop implantation after the second trench etching is optional, as above. Referring now to FIG. 10, the photoresist layer 26 is stripped. An insulating layer of silicon dioxide or polysilicon is deposited by CVD or physical vapor deposition (PVD) over the surface of the substrate to a thickness of between about 2000 to 5000 Angstroms. This layer has bad step coverage of between about 20 to 80% so that the narrow trenches 19 are not completely filled with the layer. The layer is etched by a reactive ion etch to leave spacers 25 on the sidewalls of the trenches 19. Voids 30 form within the trenches 19. If polysilicon is used, it is oxidized to form silicon dioxide on the surface of the PVD polysilicon layer. The silicon dioxide layer is etched back to the surface of the substrate. The voids 30 are completely enclosed within the trenches. These voids, having a size of between about 500 to 3000 Angstroms, will allow for the release of thermal stress within the integrated circuit.

This completes the device isolation of the integrated circuit. Both wide and narrow openings have been filled and planarized without thinning of oxide in narrow openings. No "bird's beak" or white ribbon effects are produced. The voids formed within the trench isolation regions will act to reduce the thermal stress to the circuit. The thermal stress of a circuit in the presence of voids is smaller than the stress of a circuit in the absence of voids by more than one order of magnitude.

Figure 11:
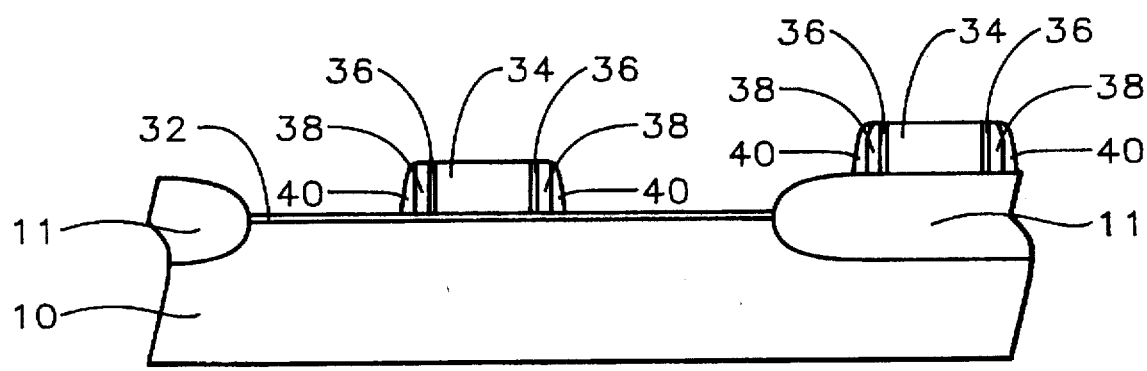
FIGS. 11 through 13 schematically illustrate in cross-sectional representation a third preferred embodiment of the present invention.
Figure 12:
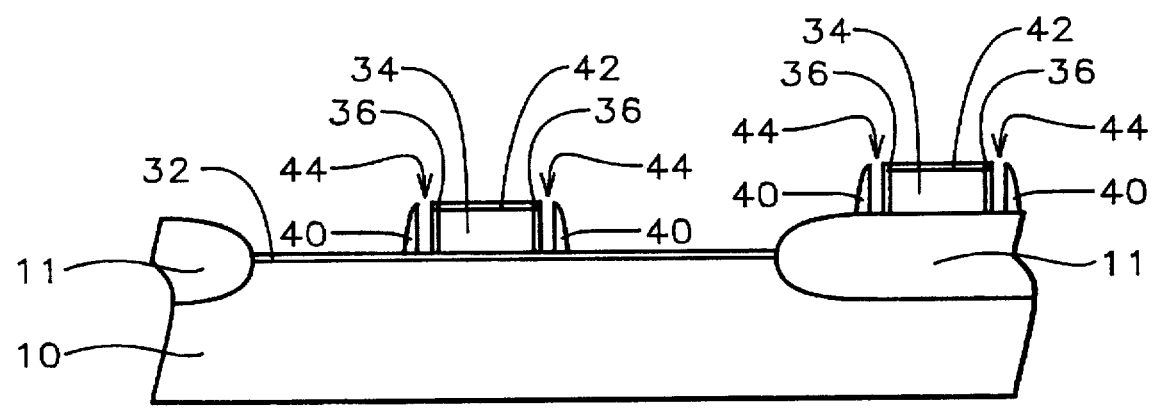
Figure 13:
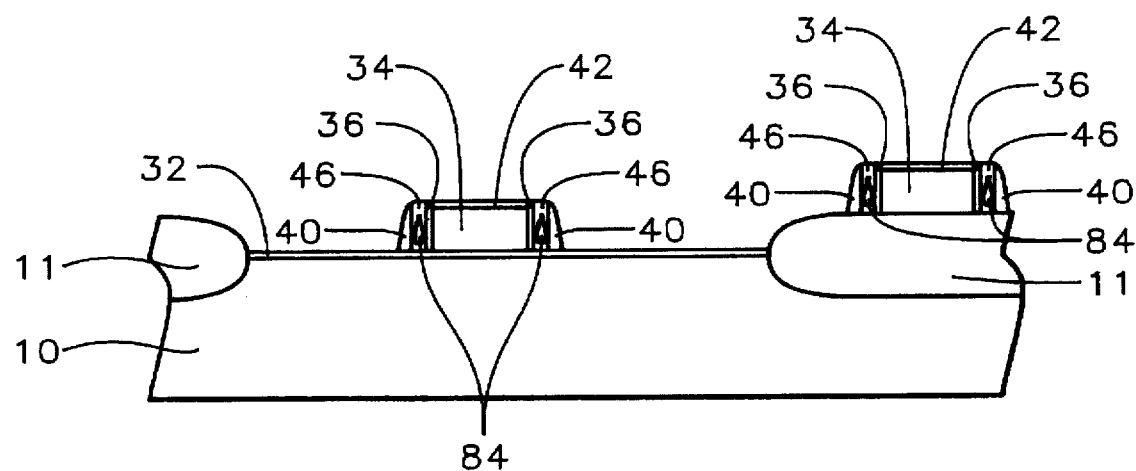

Referring now to FIGS. 11 through 13, the third embodiment of the present invention will be described. Thermal stress releasing voids will be formed within the spacers of the gate electrodes in the integrated circuit. Referring now more particularly to FIG. 11, there is shown a monocrystalline silicon substrate 10. Field oxide regions 11 have been formed as in the prior art. However, it would be advantageous to use the method of either the first or second embodiment of this invention to form trench isolation regions with voids. A gate oxide layer 32 is deposited by CVD or thermally grown on the surface of the semiconductor substrate to a thickness of between about 50 to 500 Angstroms. A layer 34 of polysilicon is deposited by CVD over the gate oxide layer 32 to a thickness of between about 1000 to 5000 Angstroms. The polysilicon layer 34 is patterned to provide gate electrodes on the surface of the FOX regions and elsewhere on the silicon substrate as illustrated in FIG. 11. Alternatively, a layer of metal silicide over polysilicon could be used to form a polycide gate electrode. A lightly doped drain (LDD) implantation (not shown) may be performed at this time. A thin silicon oxide layer is thermally grown on the sidewalls of the polysilicon gate electrodes 32. This thin silicon oxide layer 36 has a thickness of between about 50 to 200 Angstroms.

Silicon nitride spacers 38 are formed on the sidewalls of the thin silicon oxide layer 36. A layer of silicon nitride is deposited over the patterned surface of the substrate and anisotropically etched to leave sidewall spacers 38. Silicon dioxide spacers 40 are formed in the same way on the sidewalls of the silicon nitride spacers.

Referring now to FIG. 12, a thin layer of silicon dioxide 42 is grown on the top surface of the gate electrodes 34. The silicon nitride spacers 38 are stripped by hot $H_3PO_4$ leaving trenches 44 between the thin silicon oxide layer 36 and the silicon dioxide spacers 40.

Referring now to FIG. 13, a thin layer of silicon dioxide or polysilicon 46 is deposited over the surface of the substrate. This thin layer 46 has a bad step coverage of between about 20 to 80% so that the trenches 44 are not filled by the layer 46. If polysilicon is used, it is oxidized to form silicon dioxide on the surface of the polysilicon layer. The silicon dioxide layer is etched back to the surface of the substrate. The voids 84 are completely enclosed within the silicon dioxide sidewalls 36, 40, and 46 of the gate electrodes, as shown in FIG. 13. These voids, having a size of between about 300 to 1500 Angstroms, will allow for the release of thermal stress within the integrated circuit.

Figure 1:
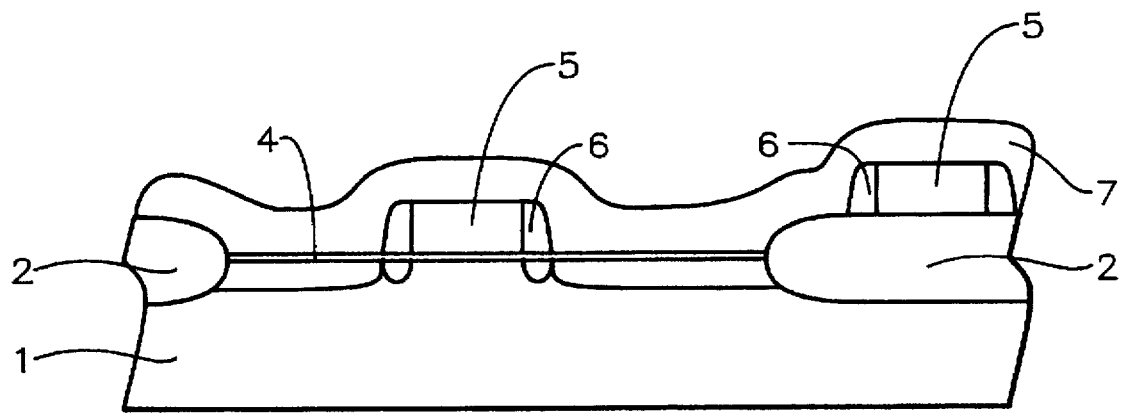
FIGS. 1 and 2 schematically illustrate in cross-sectional representation embodiments of the prior art.
Figure 2:
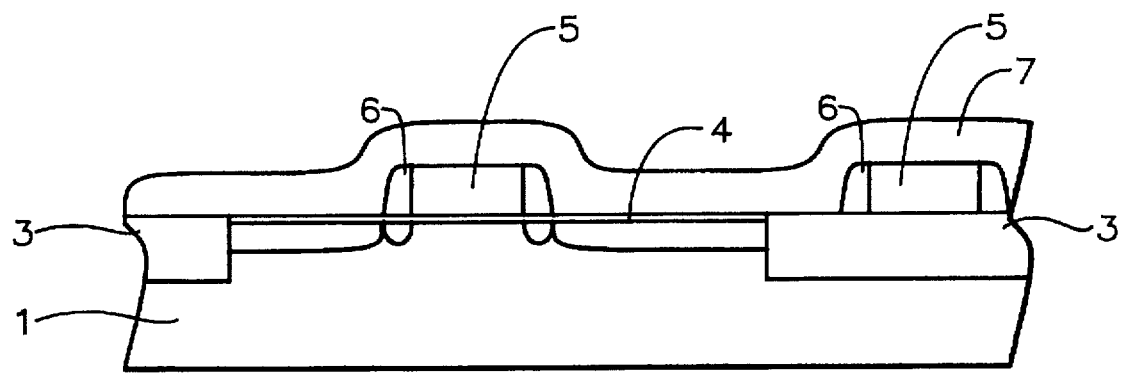
Figure 3:
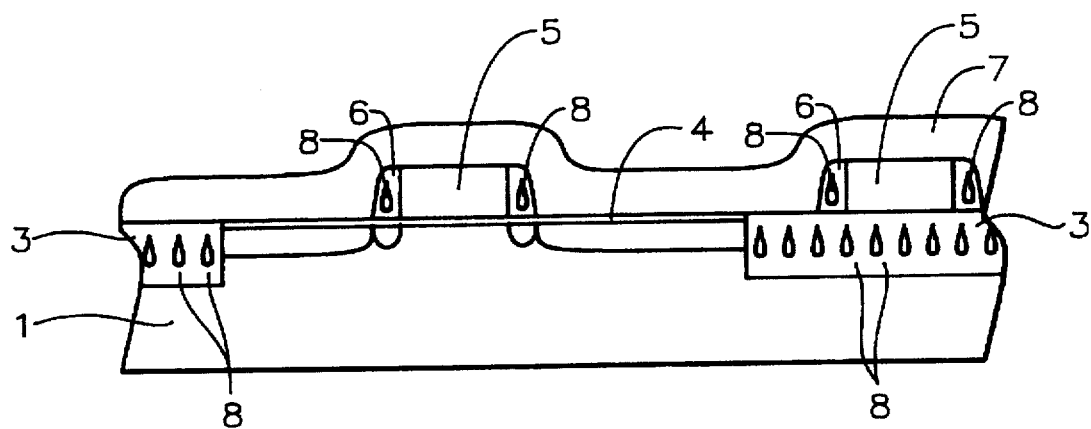
FIG. 3 schematically illustrates in cross-sectional representation an integrated circuit using the processes of the present invention.
Figure 14:
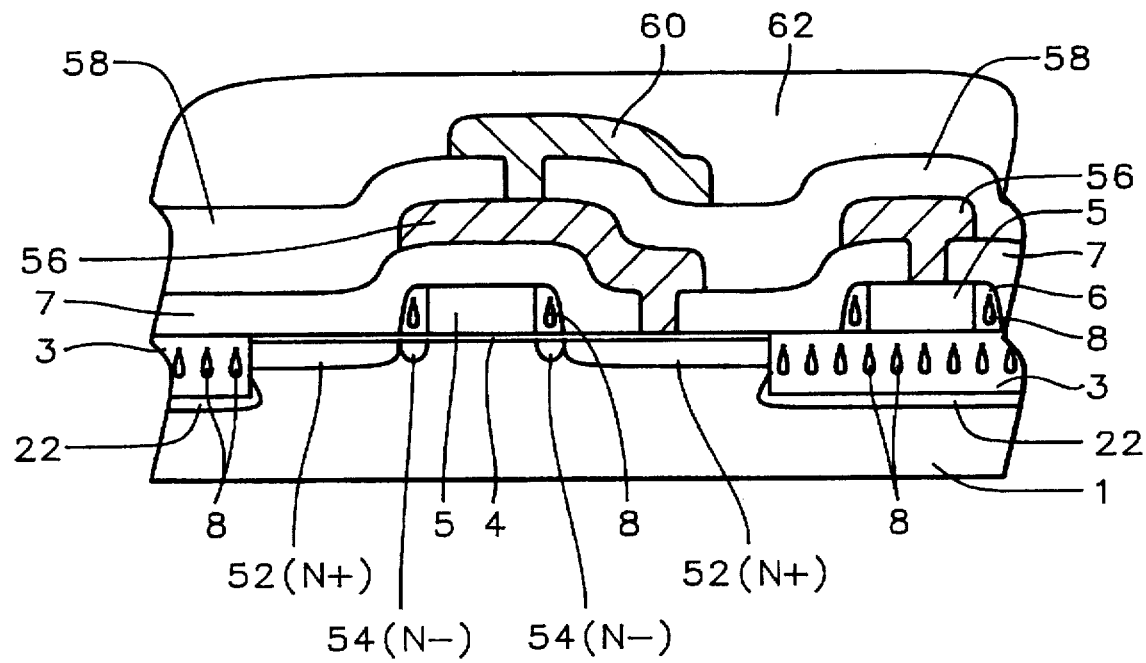
FIG. 14 schematically illustrates in cross-sectional representation a completed integrated circuit using the processes of the present invention.

The integrated circuit may be completed as is conventional in the art. For example, FIG. 14 illustrates the completion of the integrated circuit shown in FIG. 3 which combines the trench isolation methods and the spacer formation method with voids of the present invention. Source/drain regions 52 and 54 are fabricated. Dielectric layer 7, which may be a phosphorus-doped chemical vapor deposited oxide or borophosphosilicate glass (BPSG) is deposited. Contact openings are etched through the dielectric layer to expose the source/drain regions where contacts are desired. Metal layer 56, typically aluminum, is deposited and patterned to complete contacts to the source/drain regions followed by the deposition of an intermetal dielectric layer 58. A second metallization 60 is deposited and patterned. A top capping layer 62 of silicon nitride and/or an oxide complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming stress releasing voids in device isolation regions of an integrated circuit by means of a mask of plurality comprising:

providing a first insulating layer over the surface of a silicon substrate;

etching through portions of said first insulating layer not covered by a said mask plurality pattern to said silicon substrate so as to provide a plurality of narrow openings exposing portions of said silicon substrate that will form the said device isolation regions;

etching a first set of narrow trenches into said exposed portions of said silicon substrate within said narrow openings using said first insulating layer as a mask;

selectively ion implanting channel-stops through said openings into said substrate underneath said first set of trenches;

removing remaining said first insulating layer;

depositing a second insulating layer over the surface of said substrate and within said first set of trenches;

etching back said second insulating layer to leave spacers on the sidewalls of said first set of trenches wherein said spacers fill said narrow first set of trenches;

covering the surface of said substrate with a layer of photoresist and patterning said photoresist using a mask pattern to provide a set of wide and narrow openings wherein said wide and narrow openings are positioned over said first set of trenches;

etching a second set of trenches into said silicon substrate not covered by said photoresist mask and said spacers wherein said second set of trenches are immediately contiguous with said first set of trenches and wherein said first and second sets of trenches together correspond to said wide and narrow openings;

removing said photoresist layer;

depositing a third insulating layer over the surface of said substrate and within said second set of trenches wherein said third insulating layer has step coverage such that voids are formed within said second set of trenches and wherein said voids are completely enclosed within said third insulating layer within said second set of trenches; and etching back said third insulating layer resulting in wide and narrow trenches filled with said second and third insulating layers wherein said voids formed within said third insulating layer complete said thermal stress releasing device isolation of said integrated circuit.

2. The method of claim 1 wherein said first insulating layer is composed of silicon dioxide and has a preferred thickness of between about 1000 to 5000 Angstroms.

3. The method of claim 1 wherein said first set of narrow trenches are etched to a depth of between about 4000 to 20,000 Angstroms.

4. The method of claim 1 wherein said channel-stop implantation uses boron ions with a dosage of between about 1 E 13 to 1 E 14 atoms/cm$^2$ and energy of between about 10 to 50 KeV.

5. The method of claim 1 wherein said second insulating layer is composed of silicon dioxide deposited to a thickness of between about 2000 to 5000 Angstroms.

6. The method of claim 1 wherein said second set of narrow trenches are etched between said first set of trenches by a reactive ion etch.

7. The method of claim 1 wherein said second set of narrow trenches are etched between said first set of trenches by a plasma etch.

8. The method of claim 1 wherein said third insulating layer is composed of silicon dioxide and is deposited by chemical vapor deposition to a preferred thickness of between about 2000 to 5000 Angstroms.

9. The method of claim 1 wherein said third insulating layer has a step coverage of between about 20 to 80% whereby said voids with a size of between about 500 to 3000 Angstroms are formed within said third insulating layer.

10. The method of claim 9 wherein said same third insulating layer is physically vapor deposited over the surface of said substrate, and then etched back so that said voids are completely enclosed by said third insulating layer.

11. The method of claim 1 wherein said third insulating layer is composed of polysilicon and is deposited by chemical vapor deposition to a preferred thickness of between about 2000 to 5000 Angstroms.

12. The method of claim 1 wherein said third insulating layer has a step coverage of between about 20 to 80% whereby said voids with a size of between about 500 to 3000 Angstroms are formed within said third insulating layer.

13. The method of claim 12 wherein said same third insulating layer is physically vapor deposited over the surface of said substrate, oxidized, and then etched back so that said voids are completely enclosed by said third insulating layer.

* * * * *